United States Patent [19]
Eto et al.

[11] Patent Number: 6,037,813
[45] Date of Patent: Mar. 14, 2000

[54] SEMICONDUCTOR DEVICE CAPABLE OF SELECTING OPERATION MODE BASED ON CLOCK FREQUENCY

[75] Inventors: Satoshi Eto; Masao Taguchi, both of Kawasaki, Japan

[73] Assignee: Fujitsu Limited, Kanagawa, Japan

[21] Appl. No.: 08/880,912

[22] Filed: Jun. 23, 1997

[30] Foreign Application Priority Data

Jan. 20, 1997 [JP] Japan .................................. 9-008013

[51] Int. Cl.[7] .................................................. G06F 1/04
[52] U.S. Cl. .......................... 327/156; 327/159; 713/501
[58] Field of Search .............................. 395/556, 750.01, 395/750.03, 750.04, 750.05; 327/156–158, 147–149; 365/189.05, 233, 226, 227; 713/501, 300, 320, 322, 323

[56] References Cited

U.S. PATENT DOCUMENTS

| | | | |
|---|---|---|---|
| 4,893,271 | 1/1990 | Davis et al. | 364/900 |
| 5,463,337 | 10/1995 | Lenowich | 327/158 |
| 5,727,193 | 3/1998 | Takeuchi | 395/556 |
| 5,774,701 | 6/1998 | Matsui et al. | 395/560 |
| 5,805,003 | 9/1998 | Hsu | 327/149 |

FOREIGN PATENT DOCUMENTS

| | | |
|---|---|---|
| 02134924A | 5/1990 | Japan . |
| 02305026A | 12/1990 | Japan . |

*Primary Examiner*—Tuan T. Lam
*Attorney, Agent, or Firm*—Nikaido Marmelstein Murray & Oram LLP

[57] ABSTRACT

A semiconductor device which operates in synchronism with a first clock externally provided. The semiconductor device includes a clock-generation circuit generating a second clock which maintains a predetermined phase relation with the first clock, a check circuit for checking a frequency of the first clock based on at least one internal signal generated by the clock-generation circuit, and an internal circuit which switches an operation mode according to results of the checking.

14 Claims, 13 Drawing Sheets

FIG. 5
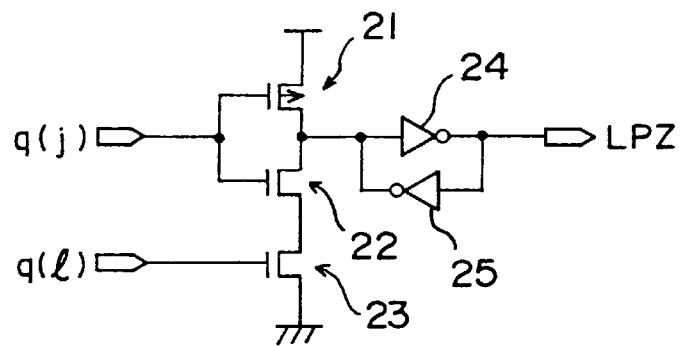
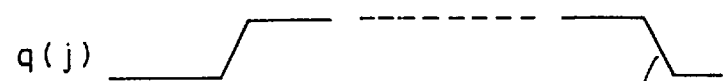
FIG. 6A  q(j)
FIG. 6B  q(ℓ)
FIG. 6C  LPZ

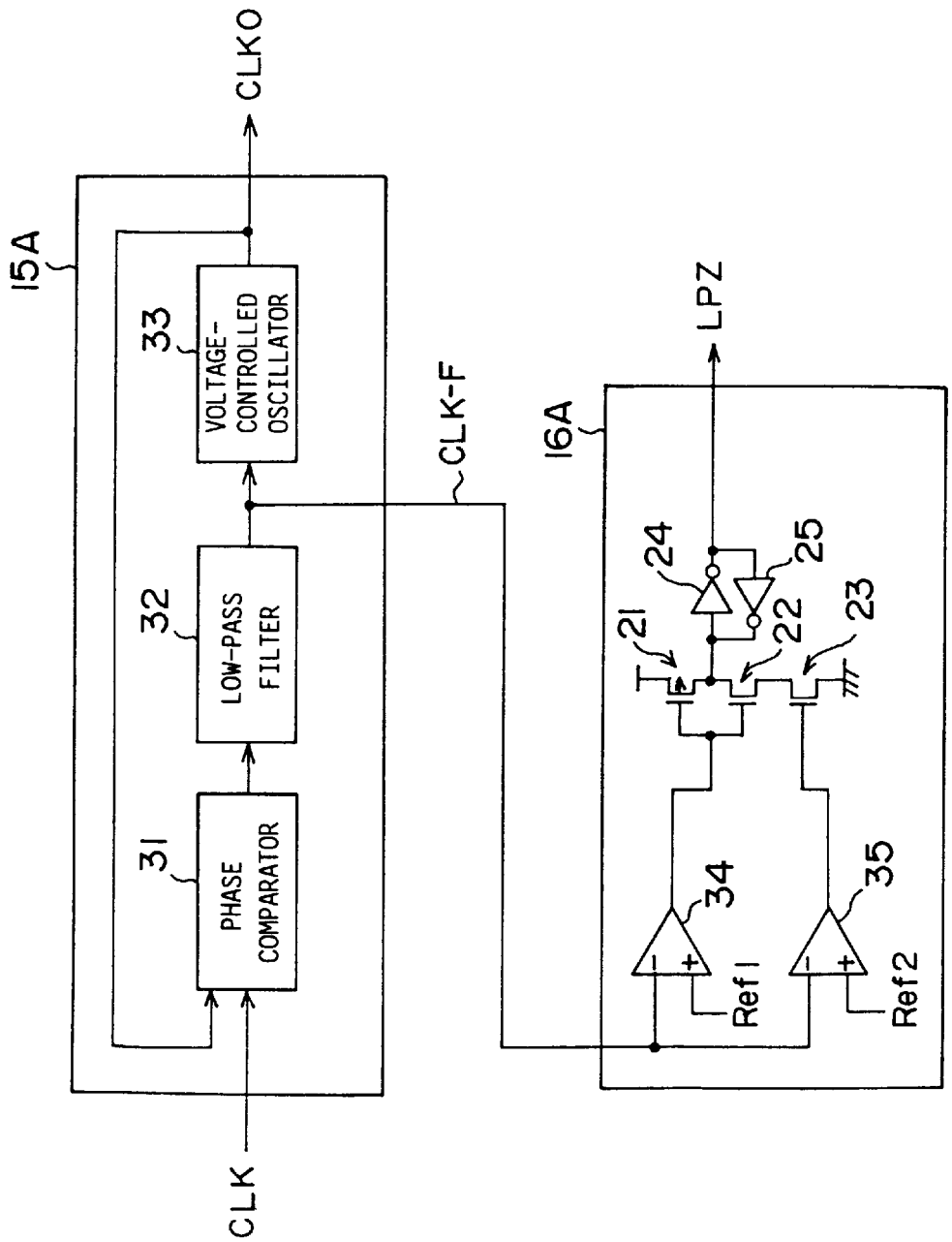

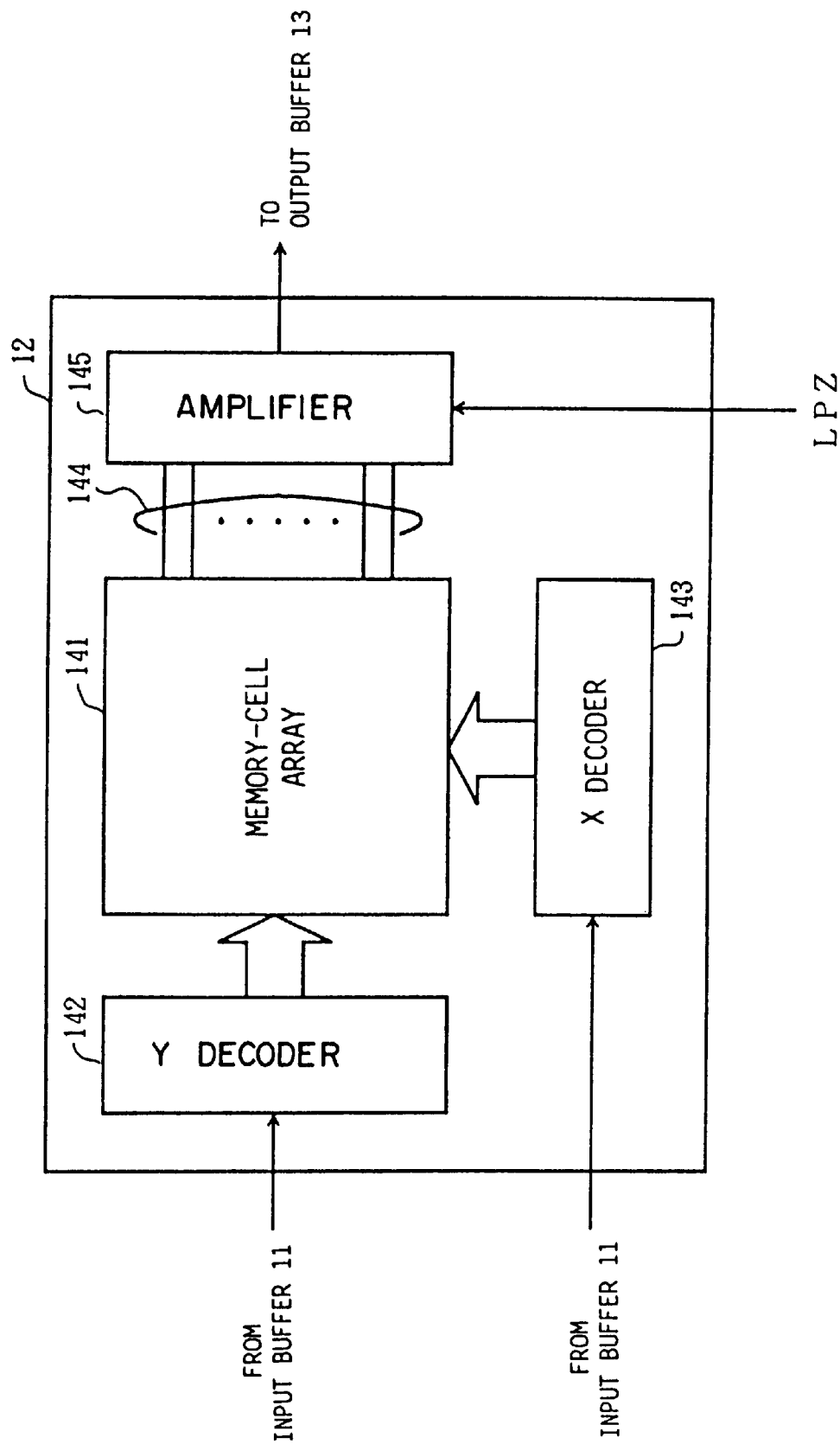

SEMICONDUCTOR DEVICE CAPABLE OF SELECTING OPERATION MODE BASED ON CLOCK FREQUENCY

BACKGROUND OF THE INVENTION

1. Field of the Invention

The present invention generally relates to semiconductor devices, and particularly relates to a semiconductor device which operates in synchronism with different clock frequencies in different operation modes.

2. Description of the Related Art

In semiconductor integrated circuits, it is desirable to use high operation frequencies to achieve high-speed operations. At the same time, there is a need to reduce power consumption in the circuits. It is difficult, however, for the same circuit to satisfy demands for high-speed operations and reduced power consumption at the same time. In general, circuits capable of high-speed operations consume large power, whereas circuits of low power consumption can operate only at low operation frequencies.

Semiconductor integrated circuits capable of operating in synchronism with high-speed clock signals can, of course, operate in a low-speed mode using low-frequency clock signals. Since such semiconductor integrated circuits have circuit configurations specifically designed for high operation frequencies, however, these circuits in the low-speed mode consume electric power as large as that consumed in high-speed operations.

To achieve the above two demands, a circuit for high-speed operations and a circuit for low power consumption may be implemented on the same semiconductor chip, so that these circuits can be switched between high-speed operations and low-speed operations with the circuit for low power consumption being used in the low-speed operations. In this case, however, a check has to be made as to which one of the high-speed mode or the low-speed mode is used, in order to switch these circuits. Unless a register or the like for storing mode settings is provided, the check has to be made based on a clock signal input to the chip.

Accordingly, there is a need for a semiconductor device which switches internal circuits in order to cope with both high-speed operations and low-power-consumption operations by checking a current operation mode based on an input clock signal.

SUMMARY OF THE INVENTION

Accordingly, it is a general object of the present invention to provide a semiconductor device which can satisfy the need described above.

It is another and more specific object of the present invention to provide a semiconductor device which switches internal circuits in order to cope with both high-speed operations and low-power-consumption operations by checking a current operation mode based on an input clock signal.

In order to achieve the above objects according to the present invention, a semiconductor device which operates in synchronism with a first clock externally provided includes a clock-generation circuit generating a second clock which maintains a predetermined phase relation with the first clock, a check circuit for checking a frequency of the first clock based on at least one internal signal generated by the clock-generation circuit, and an internal circuit which switches an operation mode according to results of the checking.

In the semiconductor device described above, an appropriate internal signal is extracted from the clock-generation circuit which is used for generating a clock (second clock) having a predetermined phase relation with an input clock (first clock), and the frequency of the input clock is detected based on the internal signal so as to switch the operation mode of the internal circuit. In this configuration, use of a conventionally existing circuit (clock-generation circuit) makes it possible to detect the frequency of the input clock synchronization signal while requiring only a simple circuit (check circuit) to be newly incorporated into a conventional configuration, and the internal circuit can switch to an operation mode suitable for a provided synchronizing frequency.

Other objects and further features of the present invention will be apparent from the following detailed description when read in conjunction with the accompanying drawings.

BRIEF DESCRIPTION OF THE DRAWINGS

FIG. 5 is a circuit diagram of an embodiment of a check circuit shown in FIG. 1;

FIGS. 6A through 6C are timing charts for explaining operations of the check circuit shown in FIG. 5;

FIG. 7 is a block diagram of a PLL and a check circuit when the PLL is used in place of the DLL in the semiconductor device of FIG. 1;

FIG. 13 is a block diagram of an embodiment of a core circuit shown in FIG. 1;

DESCRIPTION OF THE PREFERRED EMBODIMENTS

In the following, a principle and embodiments of the present invention will be described with reference to the accompanying drawings.

Figure 1:
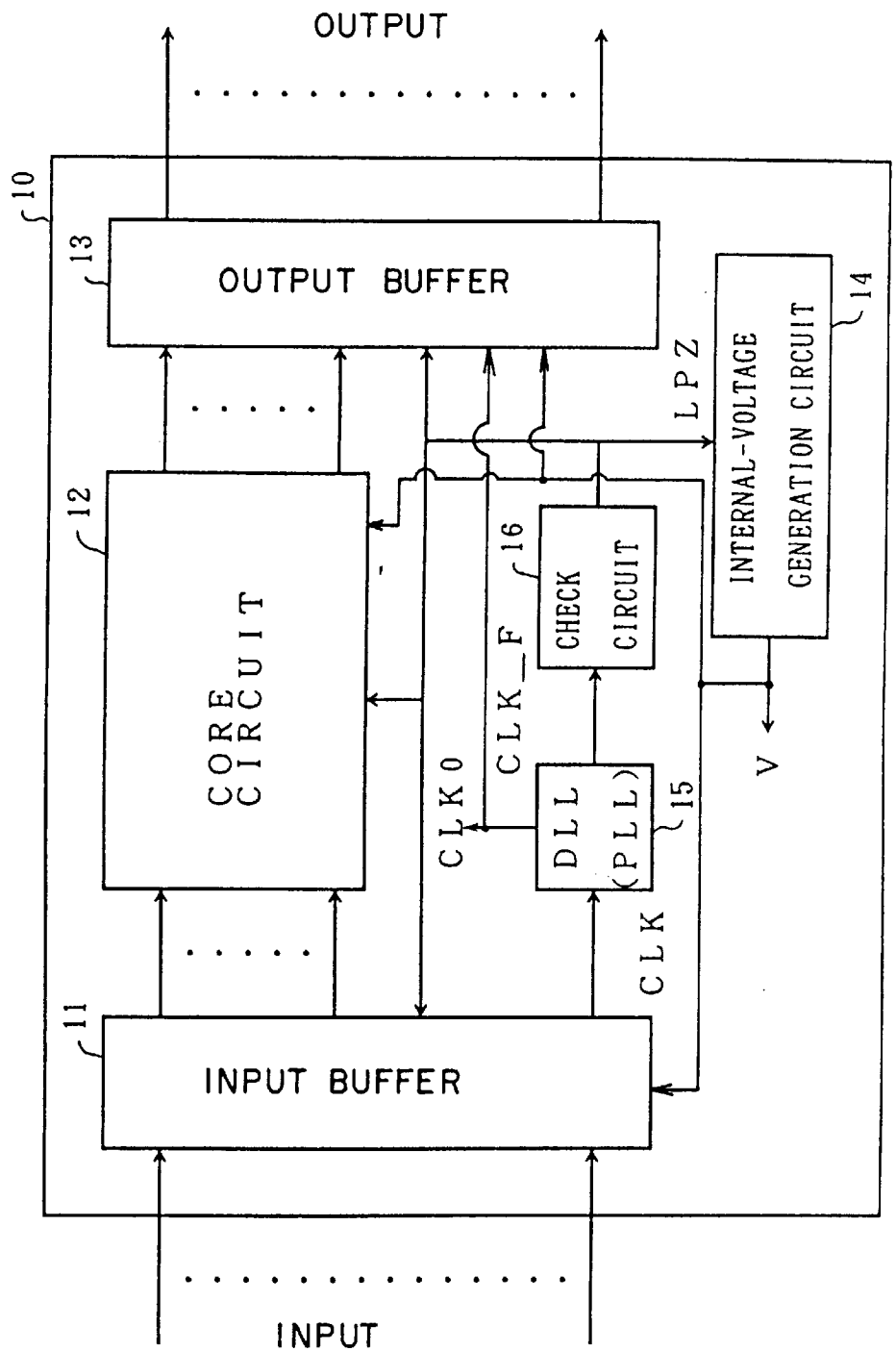
FIG. 1 is a block diagram of a semiconductor device according to a principle of the present invention.

FIG. 1 is a block diagram of a semiconductor device according to a principle of the present invention. A semiconductor device 10 of FIG. 1 includes an input buffer 11, a core circuit 12, an output buffer 13, an internal-voltage generation circuit 14, a DLL (delay-locked loop) 15, and a check circuit 16.

The DLL 15 has a conventional configuration used in the prior art. The DLL is a circuit widely used in semiconductor devices which operate in synchronism with clock signals, and an example of such devices is SDRAM. The DLL 15 in FIG. 1 generates an internal clock signal CLK0 based on an input clock signal CLK such that the internal clock signal CLK0 is phase-locked with the input clock signal CLK with a predetermined delay. In FIG. 1, a PLL (phase locked loop) circuit, which is an analog circuit, may be used in place of the DLL 15 to generate the internal clock signal CLK0 which maintains a predetermined phase relation with the input clock signal CLK.

The input buffer 11 receives and buffers input signals, and supplies them to the core circuit 12. Also, the input buffer 11 supplies the input clock signal CLK received as one of the input signals to the DLL 15. If the semiconductor device 10 is a DRAM chip, for example, the core circuit 12 may be comprised of a memory core, an address decoder, a control unit, etc. The core circuit 12 supplies output signals to the output buffer 13.

The internal clock signal CLK0 generated by the DLL 15 has a predetermined phase relation with the input clock signal CLK, and is fed to the output buffer 13. The output buffer 13 outputs the output signals from the semiconductor device 10 in synchronism with the internal clock signal CLK0. When the input buffer 11 buffers the input clock signal CLK, the received input clock signal CLK ends up sustaining a small delay. If the output buffer 13 uses the received input clock signal CLK as a synchronizing signal, output signals become out of phase compared to the original input clock signal CLK. In order to avoid this, the DLL 15 generates the internal clock signal CLK0 which maintains a predetermined phase relation with the input clock signal CLK, and the output buffer 13 uses the internal clock signal CLK0 as a synchronizing signal for signal output.

The internal-voltage generation circuit 14 generates an internal voltage V based on a power voltage (not shown) provided from an external source, and supplies the internal voltage V to the input buffer 11, the core circuit 12, and the output buffer 13.

At least one of the input buffer 11, the core circuit 12, and the output buffer 13 includes a high-speed-operation circuit responding to a high-frequency clock input and a low-power-consumption circuit responding to a low-frequency clock input. Provision of these two circuits makes it possible to switch between a high-speed operation mode and a low-power-consumption operation mode. Here, the high-speed-operation circuit and the low-power-consumption circuit do not have to be provided as separate circuits, but a single circuit may be provided to be switched between the high-speed mode and the low-power-consumption mode.

The internal-voltage generation circuit 14 may raise the internal voltage V in the high-speed mode, and lower the internal voltage V in the low-power-consumption mode.

As will be described later, signals indicative of a frequency of the input clock signal CLK are generated as intermediate products within the DLL (or PLL) 15 when the DLL 15 generates the internal clock signal CLK0. One of these signals is hereinafter referred to as a check signal CLK_F. This check signal CLK_F is extracted from the DLL 15, and supplied to the check circuit 16. Based on the check signal CLK_F, the check circuit 16 checks the frequency of the input clock signal CLK.

The check signal CLK_F may be signals for controlling the number of active delay elements in a delay line provided in the DLL 15, as will be described later. In practice, any appropriate signals can be selected based on practical consideration from internal signals of the DLL 15 which reflect the frequency of the input clock signal CLK so as to be used as the check signal CLK_F. The same applies in the case of the PLL circuit. An input signal to a VCO (voltage-controlled oscillator), for example, may be selected as a signal which reflects the frequency of the input clock signal CLK, to be used as the check signal CLK_F.

Based on the frequency of the input clock signal CLK, the check circuit 16 checks whether the operation mode is a high-speed (high-frequency) mode or a low-power-consumption (low-frequency) mode, and changes a mode signal LPZ based on the results of the check. For example, the mode signal LPZ is LOW in the high-speed mode, and is HIGH in the low-power-consumption mode. Here, the operation mode may include one or more modes in addition to the high-speed mode and the low-power-consumption mode. A middle-speed and middle-power-consumption mode, for example, may be included to provide three different modes in total. In such a case, the mode signal LPZ may be represented by more than 1-bit. Further, it is apparent that even when the operation mode includes a high-speed mode, a middle-speed mode, a low-speed mode, etc., having the same power consumption level, the check circuit 16 can check the operation mode based on the frequency of the input clock signal CLK.

The mode signal LPZ output from the check circuit 16 is supplied to the input buffer 11, the core circuit 12, the output buffer 13, and the internal-voltage generation circuit 14. At least one of the input buffer 11, the core circuit 12, the output buffer 13, and the internal-voltage generation circuit 14 switches between the high-speed mode and the low-power-consumption mode based on the mode signal LPZ. Here, when more than two modes are provided, an appropriate circuit configuration should be put in place to cope with these more than two modes.

As described above, in the semiconductor device 10 according to the present invention, the check circuit 16 checks the frequency of the input clock signal CLK based on the check signal CLK_F which is generated by the DLL (or PLL) 15 of a conventional configuration. This configuration does not need a newly provided circuit which has all the necessary functions for a frequency check since this configuration makes use of the existing DLL circuit. Because of this, the check circuit 16 having a simple structure and a small scale can check the frequency of the input clock signal CLK.

Further, based on the check results of the check circuit 16, internal circuits (hereinafter, the input buffer 11, the core circuit 12, the output buffer 13, the internal-voltage generation circuit 14, etc., are collectively referred to as internal circuits) are switched to match with the operation mode. In this manner, suitable circuit characteristics are employed in each operation mode. Namely, when the operation mode is the high-speed mode, for example, high-speed circuit characteristics are introduced. When the operation mode is the low-power-consumption mode, power consumption in the internal circuits are reduced.

In what follows, a configuration of the DLL 15 will be described. The configuration of the DLL 15 is well within the range of ordinary skill in the art, and only a brief description thereof will be provided.

Figure 2:
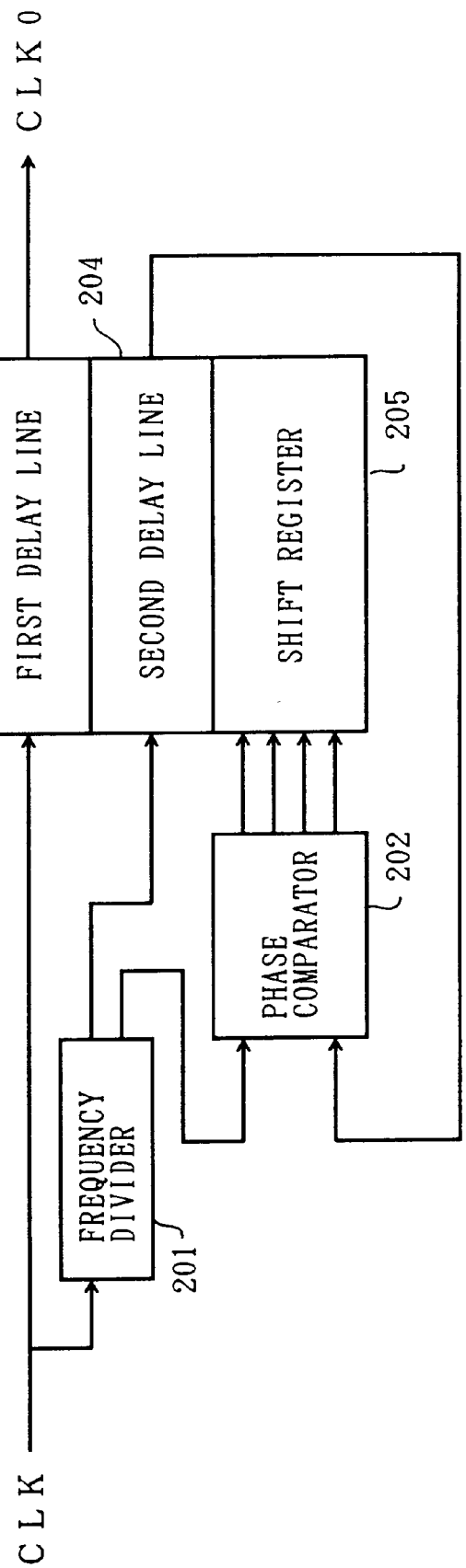
FIG. 2 is a block diagram of a DLL of FIG. 1.

FIG. 2 is a block diagram of the DLL 15.

The DLL 15 includes a frequency divider 201, a phase comparator 202, a first delay line 203, a second delay line 204, and a shift register 205.

The input clock signal CLK is input to the frequency divider 201 and the first delay line 203. The frequency divider 201 divides the frequency of the input clock signal CLK according to a predetermined ratio to produce a frequency-divided clock signal (i.e., a clock signal having a lower frequency obtained by dividing the original frequency by a predetermined number). The frequency-divided clock signal is supplied to the phase comparator 202 and the second delay line 204. The second delay line 204 delays the frequency-divided clock signal by a given delay amount according to settings made in the shift register 205 so as to produce a delayed frequency-divided clock signal. The delayed frequency-divided clock signal from the second delay line 204 is supplied to the phase comparator 202.

The phase comparator 202 compares the frequency-divided clock signal from the frequency divider 201 with the delayed frequency-divided clock signal from the second delay line 204 in terms of their phases. In detail, the phase comparator 202 determines whether a phase difference between the frequency-divided clock signal and the delayed frequency-divided clock signal falls within a predetermined range or deviates beyond this predetermined range, and further determines which one is ahead of the other when the phase difference is out of the predetermined range. Based on results of the comparison, the phase comparator 202 sends control signals to the shift register 205 so as to adjust the delay amount introduced in the second delay line 204.

The control signals from the phase comparator 202 control the settings of the shift register 205. According to these settings, the delay amount of the second delay line 204 is determined. When the above-described phase difference falls within the predetermined range, the settings of the shift register 205 are not changed. When the phase difference is out of the predetermined range, the settings of the shift register 205 are changed to adjust the delay amount of the second delay line 204 such that the phase difference falls within the predetermined range.

The first delay line 203 delays the input clock signal CLK by the same delay amount as that of the second delay line 204 according to the settings of the shift register 205. In this manner, the first delay line 203 generates the internal clock signal CLK0 which is delayed from the input clock signal CLK by a predetermined delay amount.

Figure 3:
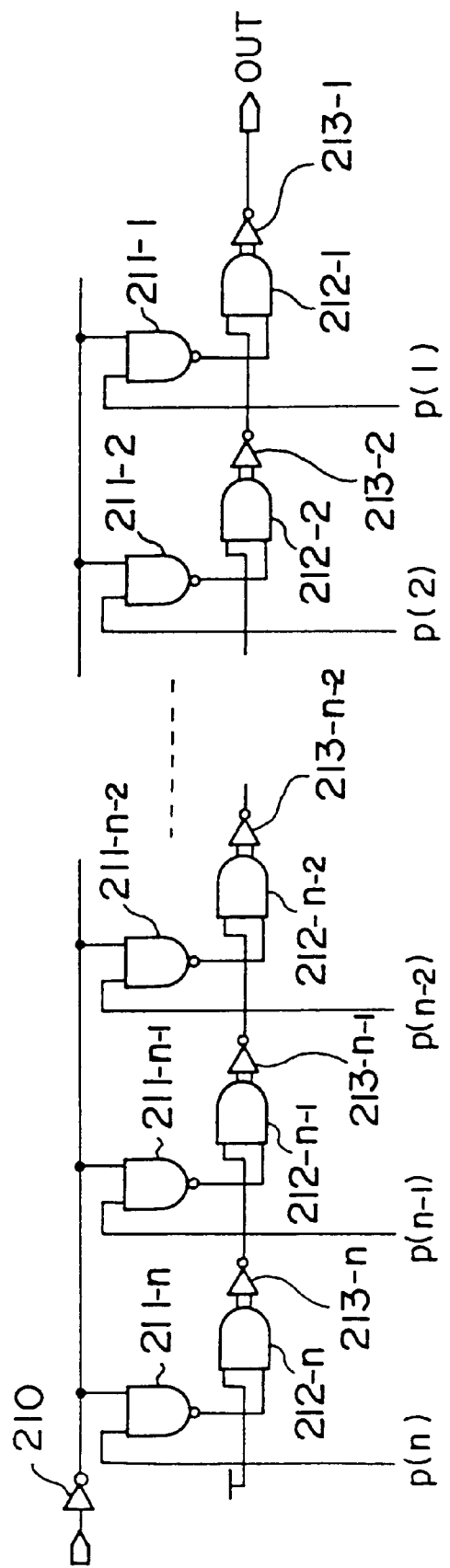
FIG. 3 is a circuit diagram of an example of a delay line of FIG. 2.

FIG. 3 is a circuit diagram of an example of a delay line. Such a delay line having a configuration as shown in FIG. 3 is used as the first delay line 203 and the second delay line 204.

The delay line of FIG. 3 includes an inverter 210, NAND circuits 211-1 through 211-n, NAND circuits 212-1 through 212-n, and inverters 213-1 through 213-n. The inverter 210 receives an input signal, and the inverter 213-1 sends out an output signal.

Each of the NAND circuits 211-1 through 211-n receives signals p(1) through p(n), respectively, at one input thereof. The other input of each of the NAND circuits 211-1 through 211-n receives an inverse of the input signal. The signals p(1) through p(n) are LOW except one signal which is HIGH. Each output of the NAND circuits 211-1 through 211-n is supplied to one input of the NAND circuits 212-1 through 212-n, respectively. Outputs of the NAND circuits 212-2 through 212-n are supplied to the other input of the NAND circuits 212-1 through 212-n-1 via the inverters 213-2 through 213-n, respectively. The other input of the NAND circuit 212-n is connected to a fixed HIGH level. An output of the NAND circuit 212-1 is sent out as an output signal via the inverter 213-1.

Among the signals p(1) through p(n), the one signal which is HIGH is referred to as p(x). The NAND circuit 211-x receiving the signal p(x) at one input thereof serves as an inverter for a signal applied to the other input thereof. The input signal to the delay line is inverted twice, once by the inverter 210 and once by this inverter (NAND circuit 211-x), so that the original input signal is supplied to a corresponding NAND circuit 212-x. Remaining NAND circuits 211-1 through 211-n other than the NAND circuit 211-x are referred to as NAND circuits 211-y. Since corresponding signals p(y) are LOW with respect to the NAND circuits 211-y, outputs of the NAND circuits 211-y are HIGH at all times. In this case, corresponding NAND circuits 212-y serve as inverters, and make up delay elements along with corresponding inverters 213-y Since one input to the NAND circuit 212-n is connected to the HIGH level, one input to the NAND circuit 212-x is HIGH. The NAND circuit 212-x thus operates as an inverter for the input signal supplied to the delay line. The input signal to the delay line passes through this inverter as well as a corresponding inverter 213-x, and further passes through the above-described delay elements provided downstream along the signal flow. The input signal is finally sent out from the inverter 213-1 as an output signal. In this configuration, the output signal ends up having a delay whose amount varies depending on the position of the HIGH signal p(x). The further the signal p(x) located upstream (larger x), the larger the delay amount. The further the signal p(x) is located downstream (smaller x), the smaller the delay amount.

Figure 4:
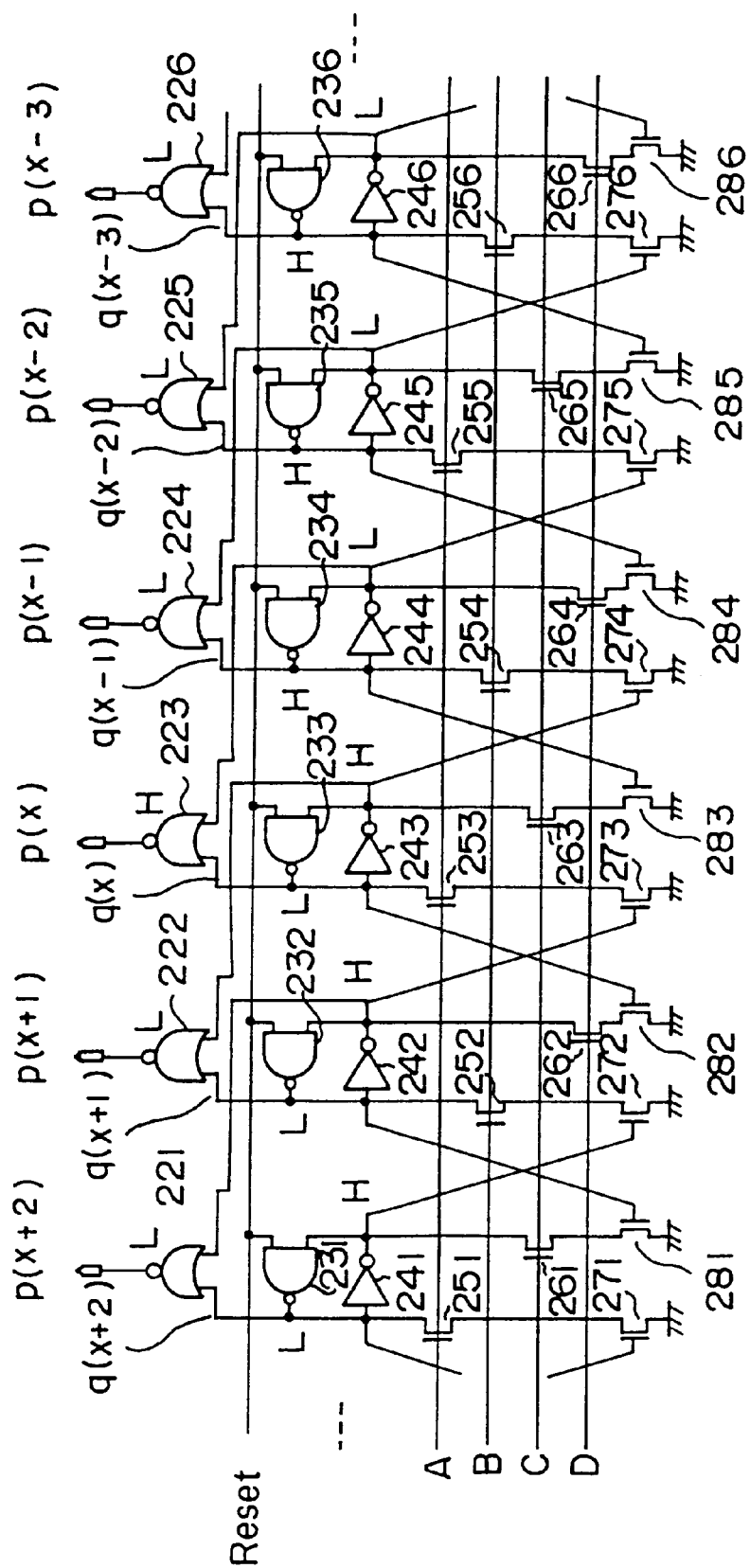
FIG. 4 is a circuit diagram of an example of a shift register of FIG. 2 which generates signals p(1) through p(n) of FIG. 3.

FIG. 4 is a circuit diagram of an example of the shift register 205 which generates the signals p(1) through p(n). FIG. 4 shows only a part of the shift register 205 which relates signals p(x-3) through p(x+2) approximately centering on the HIGH signal p(x).

The shift register 205 includes NOR circuits 221 through 226, NAND circuits 231 through 236, inverters 241 through 246, NMOS transistors 251 through 256, NMOS transistors 261 through 266, NMOS transistors 271 through 276, and NMOS transistors 281 through 286. Among the NMOS transistors 251 through 256, those of odd numbers receive a signal A as a gate input, and those of even numbers receive a signal B as a gate input. Among the NMOS transistors 261 through 266, those having odd reference numbers receive a signal C as a gate input, and those having even reference numbers receive a signal D as a gate input. The signals A through D are provided from the phase comparator 202. A signal Reset is used for initializing the shift register 205.

Outputs of the NOR circuits 221 through 226 are comprised of the signals p(x+2) through p(x-3), respectively.

In an initial state, the signal p(x), i.e., the output of the NOR circuit 223, is HIGH. If the delay amount of the delay line is to be increased by one delay element, the signal p(x) needs to be turned to LOW and the signal p(x+1) needs to become HIGH. This is achieved by providing a HIGH-pulse signal as the signal C. When the signal C is turned to HIGH, the NMOS transistor 263 is turned on, so that the output of the inverter 243 which is currently HIGH is forced to become LOW. As a result, a latch comprised of the inverter 243 and the NAND circuit 233 is subjected to a state transition so that the output of the NAND circuit 233 becomes HIGH. The output p(x) of the NOR circuit 223 is thus turned to LOW. Since the output of the inverter 243 is LOW, the output p(x+1) of the NOR circuit 222 becomes HIGH.

In this condition, if the delay amount is to be further increased by one delay element, a HIGH-pulse signal needs to be given as the signal D. In this manner, when the delay amount needs to be increased from an odd-numbered circuit of the NOR circuits 221 through 226, the signal C is turned to HIGH, whereas the signal D is turned to HIGH when increasing the delay amount from an even-numbered circuit.

In the initial state shown in FIG. 4, if the delay amount of the delay line is to be decreased by one delay element, the signal p(x) needs to be turned to LOW and the signal p(x-1) needs to become HIGH. This is achieved by providing a HIGH-pulse signal as the signal B. If the delay amount is to be further decreased by one delay element, a HIGH-pulse signal needs to be given as the signal A. In this manner, when the delay amount needs to decreased from an odd-numbered circuit of the NOR circuits 221 through 226, the signal B is turned to HIGH, whereas the signal A is turned to HIGH when decreasing the delay amount from an even-numbered circuit.

The control signals A through D are provided from the phase comparator 202 which detects a phase difference between the frequency-divided clock signal and the delayed frequency-divided clock signal. A description of the phase comparator 202 and the frequency divider 201 will be omitted.

As described above, the signals p(1) through p(n) shown in FIG. 3 and FIG. 4 determine the delay amount of the delay line. As a frequency of the input signal to the delay line is increased, the delay amount required for achieving a desired phase delay is decreased since the cycle of the input signal is shortened. Namely, the delay amount of the delay line is set to a relatively small amount when the frequency of the input clock signal CLK is relatively high, while the delay amount is set to a relatively large amount when the frequency of the input clock signal CLK is relatively low. When the signals p(1) through p(n) are considered, the number x of the HIGH signal p(x) is relatively small when the input clock signal CLK has a relatively high frequency. As the frequency of the input clock signal CLK is lowered, the number x of the HIGH signal p(x) is increased. Accordingly, the signals p(1) through p(n) provide direct indicators of the frequency of the input clock signal CLK. Because of this, the signals p(1) through p(n) or other related signals can be used as the check signal CLK_F shown in FIG. 1.

FIG. 5 is a circuit diagram of an embodiment of the check circuit 16 shown in FIG. 1.

The check circuit 16 of FIG. 5 receives two signals q(j) and q(l) (j<l) which are selected from signals q(1) through q(n) applied as one of the inputs to the NOR circuits outputting the signals p(1) through p(n) in the same manner as shown in FIG. 4. In the embodiment of FIG. 5, the signals q(j) and q(l) are used as the check signal CLK_F.

With the signal p(x) as a watershed point, the signals q(1) through q(x-1) corresponding to higher frequencies are HIGH, and the signals q(x) through q(n) corresponding to lower frequencies are LOW. When a signal q(k) corresponding to a given input-signal frequency is selected, the signal q(k) is HIGH when the input clock signal CLK has a frequency lower than the predetermined frequency. On the other hand, the signal q(k) is LOW when the frequency of the input clock signal CLK is higher than the predetermined frequency. The signal q(k) thus can be used as the mode signal LPZ.

Use of the signal q(k) as the mode signal LPZ has a problem in that the frequency detection becomes too sensitive to noise. The input clock signal CLK supplied to the semiconductor device 10 comes under influence of noise. Because of this influence, the number of active delay elements in the DLL 15 varies so that the delay amount defined by this number also varies. If the frequency of the input clock signal CLK is close to the frequency corresponding to the signal q(k), a fluctuation in the number of active delay elements in the DLL 15 will lead to an irregular variation of the signal q(k) between the HIGH level and the LOW level. From a practical viewpoint, it is not preferable to use the signal q(k) as the mode signal LPZ.

The check circuit 16 of FIG. 5 uses the two signals q(j) and q(l) so as to introduce hysteresis characteristics against frequency fluctuation. The check circuit 16 includes a PMOS transistor 21, NMOS transistors 22 and 23, and inverters 24 and 25. The inverters 24 and 25 receive an output from each other as an input so as to make up a latch circuit.

FIGS. 6A through 6C are timing charts for explaining operations of the check circuit 16 shown in FIG. 5. With reference to FIG. 5 and FIGS. 6A through 6C, operations of the check circuit 16 will be described below.

Assume that the frequency of the input clock signal CLK is sufficiently high in an initial state such that the signals q(j) and q(l) are LOW. In this state, the PMOS transistor 21 is turned on, and the NMOS transistors 22 and 23 are turned off. An input to the inverter 24 is HIGH, so that the latch circuit comprising the inverters 24 and 25 produces a LOW signal as an output (mode signal) LPZ.

As the frequency of the input clock signal CLK lowers from the initial state, the signal q(j) becomes HIGH while the signal q(l) remains LOW. In this case, the PMOS transistor 21 is turned off, and the NMOS transistor 22 is turned on. Since the NMOS transistor 23 remains turned off, the input to the inverter 24 becomes floating (i.e., not connected to any voltage level). The latch circuit comprised of the inverters 24 and 25 thus holds the current state to produce a LOW signal as the output LPZ.

As the frequency of the input clock signal CLK further lowers, both of the signals q(j) and q(l) become HIGH. In this condition, the PMOS transistor 21 is turned off, and the NMOS transistors 22 and 23 are turned on. The input to the inverter 24 is forced to become LOW, so that the latch circuit comprising the inverters 24 and 25 produces a HIGH signal as the output LPZ.

It should be noted that the change in the output LPZ from LOW to HIGH is brought about by the change in the signal q(l) as shown in FIGS. 6B and 6C.

Assume that the frequency of the input clock signal CLK turns to go higher from the above-stated condition in which both of the signals q(j) and q(l) are HIGH. As the frequency goes higher, the signal q(j) remains HIGH while the signal q(l) becomes LOW. In this case, the NMOS transistor 23 is turned off, while the PMOS transistor 21 and the NMOS transistor 22 remain turned off and turned on, respectively. The input to the inverter 24 thus becomes floating. The latch circuit comprised of the inverters 24 and 25 holds the current state to produce a HIGH signal as the output LPZ.

As the frequency further rises, both of the signals q(j) and q(l) become LOW. In this case, the PMOS transistor 21 is turned on, and the NMOS transistors 22 and 23 are turned off. The input to the inverter 24 is forced to become HIGH, so that the latch circuit comprising the inverters 24 and 25 produces a LOW signal as the output LPZ.

In this manner, the change in the output LPZ from HIGH to LOW is initiated by the change in the signal q(j).

As described above, when the frequency of the input clock signal CLK goes down, the mode signal LPZ is turned to HIGH only when the frequency reaches a first frequency corresponding to the signal q(l). When the frequency of the input clock signal CLK goes up, the mode signal LPZ becomes LOW only after the frequency exceeds a second frequency corresponding to the signal q(j). Here, it should be noted that the first frequency is lower than the second frequency. Because of this, even when the frequency of the input clock signal CLK fluctuates due to influence of noise, the mode signal LPZ is not affected as long as the fluctuation is limited within the range between the first frequency and the second frequency. In this manner, the mode signal LPZ which is not susceptible to noise can be obtained.

FIG. 7 is a block diagram of a PLL 15A and a check circuit 16A when the PLL 15A is used in place of the DLL 15 in the semiconductor device 10 of FIG. 1.

The PLL 15A of FIG. 7 includes a phase comparator 31, a low-pass filter 32, and a voltage-controlled oscillator 33. The phase comparator 31 receives the input clock signal CLK and the internal clock signal CLK0, and compares phases of these clock signals with each other. The phase comparator 31 supplies a voltage signal representing results of the comparison to the low-pass filter 32. The low-pass filter 32 applies low-pass filtering to the voltage signal, and provides the filtered voltage signal to the voltage-controlled oscillator 33. Based on the filtered voltage signal, the voltage-controlled oscillator 33 oscillates so as to generate the internal clock signal CLK0. The internal clock signal CLK0 is fed back to the phase comparator 31. As is well known in the art, the PLL circuit having such a configuration as described above can generate the internal clock signal CLK0 which has a predetermined phase relation with the input clock signal CLK.

The check circuit 16A receives the (filtered) voltage signal which is input to the voltage-controlled oscillator 33 of the PLL 15A. Here, this voltage signal serves as the check signal CLK_F. The check circuit 16A includes the PMOS transistor 21, the NMOS transistors 22 and 23, the inverters 24 and 25, and differential amplifiers 34 and 35. In FIG. 7, the same elements as those of FIG. 5 are referred to by the same numerals, and a description thereof will be omitted. In FIG. 7, the voltage input to the voltage-controlled oscillator 33 (i.e., the check signal CLK_F) decreases as the frequency of the input clock signal CLK decreases.

The differential amplifier 34 receives the check signal CLK_F at one input thereof, and receives a reference voltage Ref1 at the other input thereof. The differential amplifier 34 produces a LOW output when the check signal CLK_F is higher than the reference voltage Ref1. Likewise, the differential amplifier 35 receives the check signal CLK_F at one input thereof, and receives a reference voltage Ref2 at the other input thereof, so that the differential amplifier 35 produces a LOW output when the check signal CLK_F is higher than the reference voltage Ref2. Here, the reference voltage Ref1 is higher than the reference voltage Ref2.

If the frequency of the input clock signal CLK is sufficiently high such that both outputs of the differential amplifiers 34 and 35 are LOW, the mode signal LPZ is LOW at an output of the check circuit 16A. As the frequency lowers, the voltage of the check signal CLK_F at some point falls within the range between the reference voltage Ref1 and the reference voltage Ref2. In this condition, however, the mode signal LPZ output from the check circuit 16A remains LOW. As the frequency lowers further, the voltage of the check signal CLK_F become lower than the reference voltage Ref2. Only at this point, does the mode signal LPZ output from the check circuit 16A turns into HIGH. When the frequency turns to go up from this point, the mode signal LPZ remains HIGH as long as the voltage of the check signal CLK_F is lower than the reference voltage Ref1. The mode signal LPZ becomes LOW only when the frequency becomes sufficiently high such that the voltage of the check signal CLK_F is higher than the reference voltage Ref1.

Accordingly, even when the frequency of the input clock signal CLK fluctuates because of the influence of noise, the mode signal LPZ is not affected as long as the fluctuation only causes a voltage variation in the check signal CLK_F which falls within the range between the two reference voltages. In this manner, the mode signal LPZ which is not susceptible to noise can be obtained.

Figure 8:
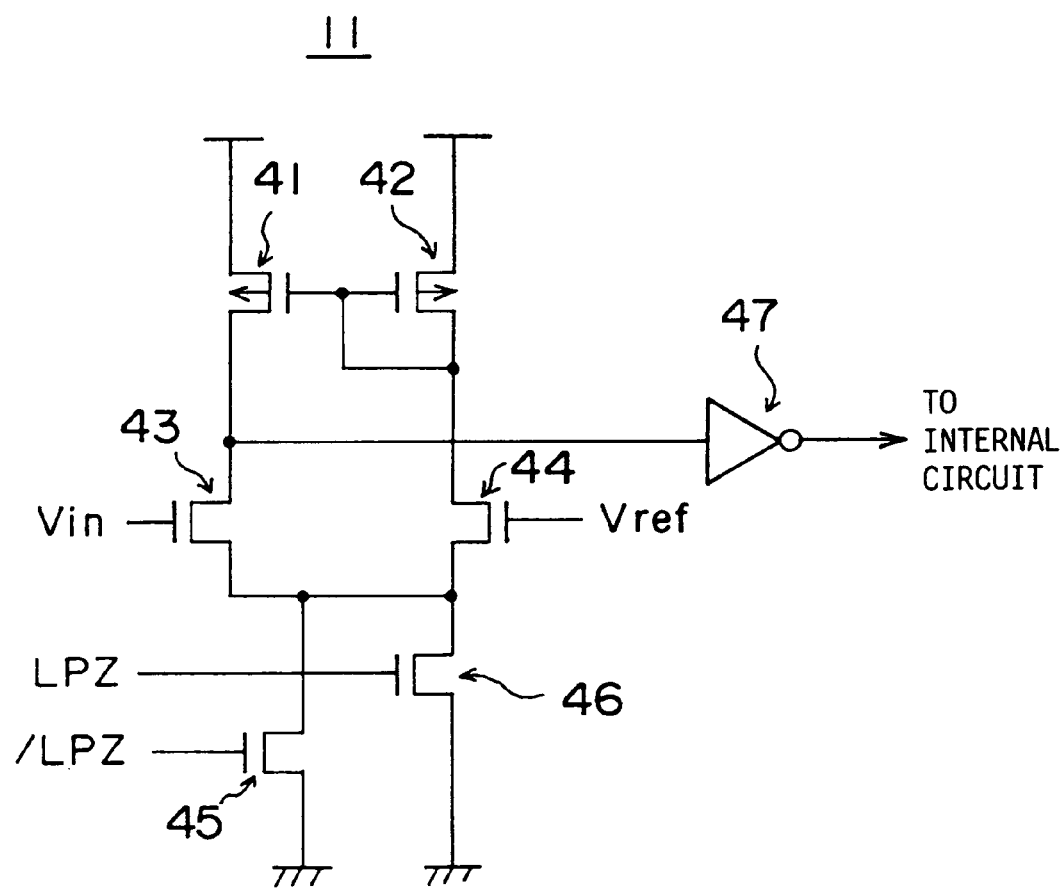
FIG. 8 is a circuit diagram of a first embodiment of an input buffer shown in FIG. 1.

FIG. 8 is a circuit diagram of a first embodiment of the input buffer 11 shown in FIG. 1. The input buffer 11 of FIG. 8 includes PMOS transistors 41 and 42, NMOS transistors 43 through 46, and an inverter 47. The NMOS transistors 45 and 46 are selectively driven by the mode signal LPZ (and /LPZ). When the mode signal LPZ is HIGH, the NMOS transistor 46 operates. When the mode signal LPZ is LOW, on the other hand, the NMOS transistor 45 is driven.

When one of the NMOS transistors 45 and 46 is driven, an input buffer shown in FIG. 8 operates as a buffer of a differential-amplifier type. When an input-signal voltage Vin is higher than a reference voltage Vref, an output of the inverter 47 becomes HIGH. When the input-signal voltage Vin is lower than the reference voltage Vref, on the other hand, the inverter 47 produces a LOW output. The output of the inverter 47 is supplied to the internal circuits such as the core circuit 12 and the DLL 15 (FIG. 1) as input data.

The NMOS transistor 45 has higher driving power than the NMOS transistor 46. Namely, when the mode signal LPZ is LOW and, thus, the NMOS transistor 45 is turned on, the input buffer 11 is driven by a relatively large current. In this configuration, therefore, the input buffer 11 is driven by a relatively large current when the frequency of the input clock signal CLK is high, thereby coping with high-speed operations.

The NMOS transistor 46 has lower driving power than the NMOS transistor 45. Namely, when the mode signal LPZ is HIGH and, thus, the NMOS transistor 46 is turned on, the input buffer 11 is driven by a relatively small current. In this configuration, therefore, the input buffer 11 is driven by a relatively small current when the frequency of the input clock signal CLK is low, thereby suppressing power consumption within the input buffer 11.

As described above, the input buffer 11 of FIG. 8 changes the amount of current for driving the buffer, depending on the mode signal LPZ which indicates the frequency of the input clock signal CLK. This configuration makes it possible to cope with a high-speed clock signal and to suppress the power consumption of the buffer in the case of a low-speed clock signal.

Figure 9:
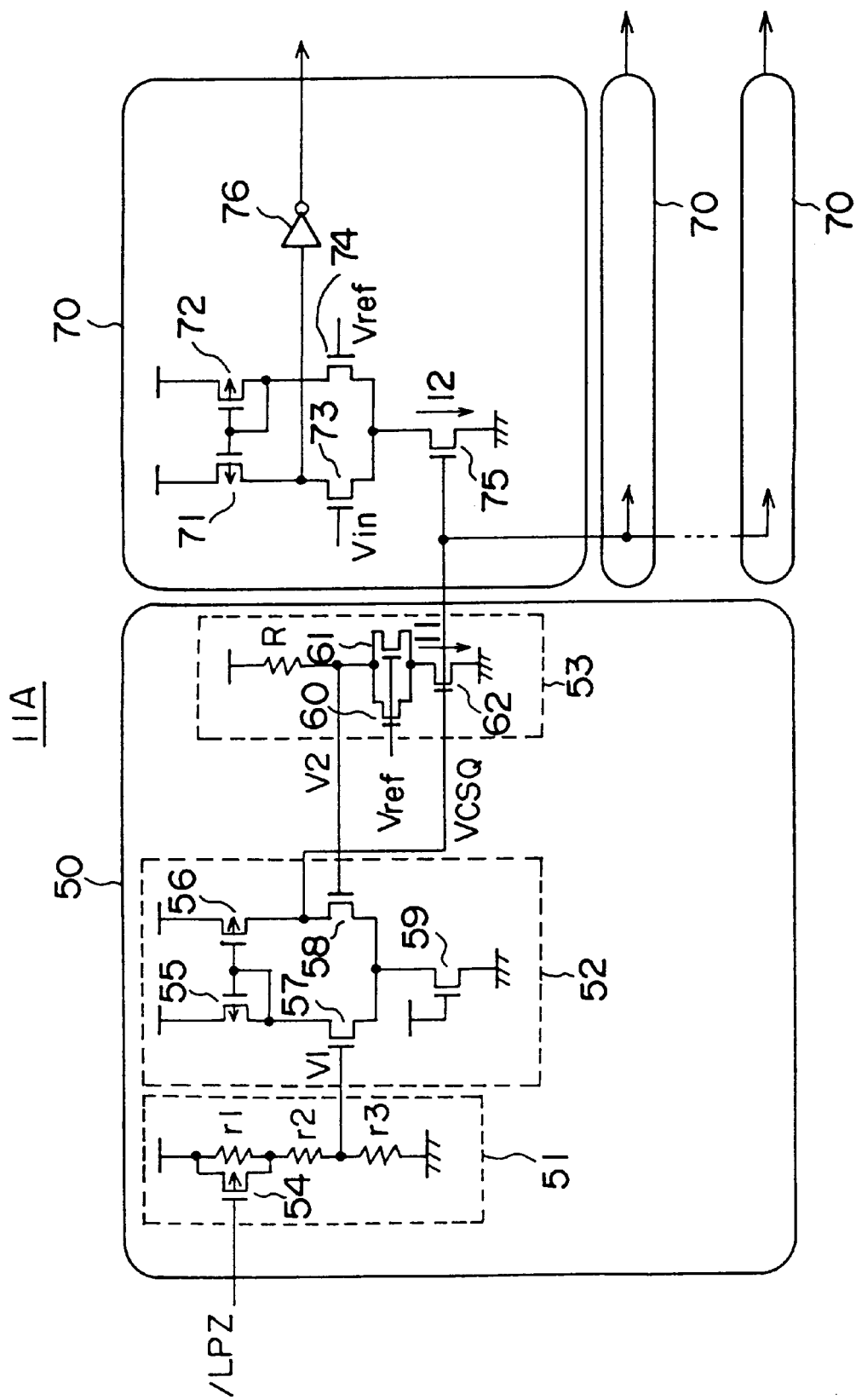
FIG. 9 is a circuit diagram of a second embodiment of the input buffer shown in FIG. 1.

FIG. 9 is a circuit diagram of a second embodiment of the input buffer shown in FIG. 1. An input buffer 11A of FIG. 9 includes a current-control circuit 50 and a plurality of input-buffer units 70.

Each of the input-buffer units 70 receives the input-signal voltage Vin as one bit of the input data, and compares the input-signal voltage Vin with the reference voltage Vref. Each of the input-buffer units 70 then supplies one bit of the input data to the internal circuits, in which a value of the supplied bit depends on which one of the input-signal voltage Vin and the reference voltage Vref is larger than the other. Each of the input-buffer units 70 includes PMOS transistors 71 and 72, NMOS transistors 73 through 75, and an inverter 76. The NMOS transistor 73 receives the input-signal voltage Vin at the gate thereof. When the input-signal voltage Vin is lower than the reference voltage Vref, an input to the inverter 76 is turned to HIGH, thereby providing a LOW signal to the internal circuits. When the input-signal voltage Vin is higher than the reference voltage Vref, the input to the inverter 76 is turned to LOW, thereby providing a HIGH signal to the internal circuits. The NMOS transistor 75 is used for driving the input-buffer unit 70. As will be described later, the amount of current i2 passing through the NMOS transistor 75 is controlled so as to be large in the high-speed mode and to be small in the low-power-consumption mode.

The current-control circuit 50 is used for controlling the current i2 flowing through the NMOS transistor 75 with respect to each of the input-buffer units 70. In general, the reference voltage Vref is provided from outside the chip, and is bound to have some fluctuation due to influence of noise or the like. It is undesirable, however, to allow the current i2 to fluctuate when passing through the NMOS transistor 75 of the input-buffer unit 70 due to the fluctuation of the reference voltage Vref. This is undesirable, especially, when stability of chip operations is considered. To obviate this problem, the current-control circuit 50 is used to keep the current i2 constant regardless of the fluctuation of the reference voltage Vref.

The current-control circuit 50 includes a voltage generation unit 51, a differential amplifier 52, and a replica circuit 53. The voltage generation unit 51 includes a PMOS transistor 54 and resistors r1 through r3, and generates a predetermined voltage level V1 by using the resistors to divide a voltage. The differential amplifier 52 includes PMOS transistors 55 and 56 and NMOS transistors 57 through 59. The differential amplifier 52 adjusts a voltage VCSQ such that a voltage V2 in the replica circuit 53 becomes equal to the predetermined voltage V1 generated by the voltage generation unit 51.

The replica circuit 53 is a replica of the input-buffer unit 70, and includes a resistor R and NMOS transistors 60 through 62. The NMOS transistor 62 receives the voltage VCSQ as a gate input in the same manner as the NMOS transistor 75 of the input-buffer unit 70 receives the voltage VCSQ as the gate input. A current i1 passing through the NMOS transistor 62 is thus in proportion to the current i2 flowing through the NMOS transistor 75. Since the current i1 also passes through the resistor R, a voltage difference between the two ends of the resistor R is constant as long as the current i1 is constant. As a result, the voltage V2 at a joint point between the resistor R and a pair of the NMOS transistors 60 and 61 is constant as long as the current i1 remains constant.

The NMOS transistors 60 and 61 receive the reference voltage Vref as a gate input, so that fluctuation in the reference voltage Vref causes fluctuation to a voltage difference between the drain and the source of the NMOS transistors 60 and 61. When the current i1 and the voltage V2 are changed because of the fluctuation in the reference voltage Vref, a drain-source voltage difference of the NMOS transistor 58 is changed since the NMOS transistor 58 receives the voltage V2 as the gate input. As a result, the voltage VCSQ changes. The change in the voltage VCSQ brings about a change in the current i1 such that the voltage V2 becomes equal to the voltage V1 generated by the voltage generation unit 51. Accordingly, the voltage V2 is controlled to be a constant voltage equal to the voltage V1 irrespective of the fluctuation of the reference voltage Vref.

Since the voltage V2 is controlled to be constant, the current i1 is also controlled to be constant.

Accordingly, the current i2 passing through the NMOS transistor 75 of the input-buffer unit 70 is controlled so as to be constant regardless of the fluctuation of the reference voltage Vref.

The PMOS transistor 54 of the voltage generation unit 51 is provided in parallel with the resistor r1, and receives an inverse of the mode signal LPZ as a gate input. In the high-speed mode, the inverse mode signal /LPZ is HIGH, so that the PMOS transistor 54 is turned off. In this case, the voltage V1 generated by the voltage generation unit 51 is equal to r3/(r1+r2+r3). In the low-power-consumption mode, the inverse mode signal /LPZ is LOW, so that the PMOS transistor 54 is turned on. In this case, the voltage V1 generated by the voltage generation unit 51 is equal to r3/(r2+r3). In this manner, the voltage V1 is higher in the low-power-consumption mode than in the high-speed mode. Because of this change in the voltage V1, the current i1 and the current i2 are relatively large in the high-speed mode, and are relatively small in the low-power-consumption mode.

As described above, the current i2 passing through the NMOS transistor 75 of the input-buffer unit 70 is kept constant regardless of fluctuation of the reference voltage Vref. In addition, the current i2 is relatively large in the high-speed mode to allow each of the input-buffer units 70 to operate at high speed, and is relatively small in the low-power-consumption mode so as to suppress power consumption in each of the input-buffer units 70. In this manner, the second embodiment of FIG. 9 makes it possible to use the current-control circuit 50 for controlling the plurality of input-buffer units 70.

Figure 10:
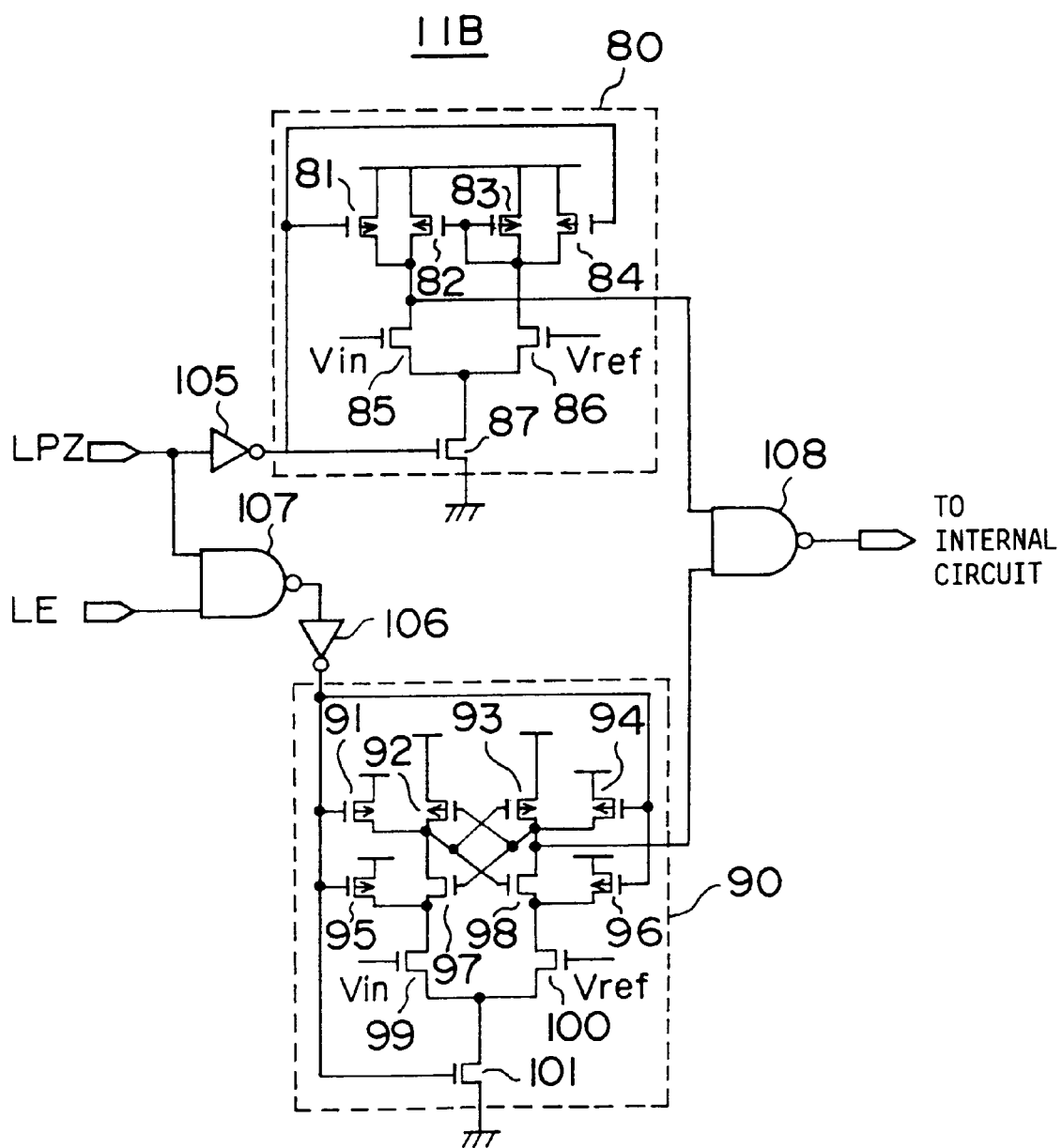
FIG. 10 is a circuit diagram of a third embodiment of the input buffer shown in FIG. 1.

FIG. 10 is a circuit diagram of a third embodiment of the input buffer shown in FIG. 1. An input buffer 11B of FIG. 10 includes a high-speed-and-high-power-consumption buffer 80, a low-speed-and-low-power-consumption buffer 90, inverters 105 and 106, and NAND circuits 107 and 108.

The high-speed-and-high-power-consumption buffer 80 includes PMOS transistors 81 through 84 and NMOS transistors 85 through 87. A basic configuration of the high-speed-and-high-power-consumption buffer 80 is the same as that of a conventional differential amplifier, and basic operations thereof are the same as those of the circuit shown in FIG. 8. A description of the configuration and operations will be omitted.

It should be noted, however, that an inverse of the mode signal LPZ is supplied from the inverter 105 to gate inputs of the PMOS transistors 81 and 84 as well as to a gate input of the NMOS transistor 87. When the mode signal LPZ is LOW (high-speed mode), the NMOS transistor 87 is turned on, and PMOS transistors 81 and 84 are turned off. In this case, the high-speed-and-high-power-consumption buffer 80 operates as a differential amplifier. When the mode signal LPZ is HIGH (low-power-consumption mode), the NMOS transistor 87 is turned off, and PMOS transistors 81 and 84 are turned on. In this case, the high-speed-and-high-power-consumption buffer 80 produces a HIGH output at all the time.

The low-speed-and-low-power-consumption buffer 90 includes PMOS transistors 91 through 96 and NMOS transistors 97 through 101. A basic configuration of the low-speed-and-low-power-consumption buffer 90 is the same as that of a conventional latch-type buffer, and a description thereof will be omitted.

It should be noted, however, that an output of the inverter 106 inverting the output of the NAND circuit 107, i.e., a logical product of the mode signal LPZ and a latch-enable signal LE, is provided to the gate inputs of the PMOS transistors 91, 94, 95, and 96.

When the mode signal LPZ is HIGH (low-power-consumption mode), a change to HIGH in the latch-enable signal LE turns the NMOS transistor 101 on, and turns PMOS transistors 91, 94, 95, and 96 off. In this case, the low-speed-and-low-power-consumption buffer 90 latches the input data whose value depends on which one of the input-signal voltage Vin and the reference voltage Vref is larger than the other. If the latch-enable signal LE is LOW, the NMOS transistor 101 is turned off, and the PMOS transistors 91, 94, 95, and 96 are turned on irrespective of the mode signal LPZ. In this case, the low-speed-and-low-power-consumption buffer 90 maintains a HIGH output at all times.

The low-speed-and-low-power-consumption buffer 90 is characterized in that the power consumption thereof is relatively small, especially when the clock cycle is long, because a driving current flows only at a moment when the input-signal voltage Vin is latched. When the mode signal LPZ is HIGH, i.e., when the cycle of the input clock signal CLK (FIG. 1) is larger than a predetermined length, use of the low-speed-and-low-power-consumption buffer 90 rather than the high-speed-and-high-power-consumption buffer 80 can avoid excessive power consumption for buffering the input-signal voltage Vin. Here, the NAND circuit 108 is used for supplying an output from an active one of the high-speed-and-high-power-consumption buffer 80 and the low-speed-and-low-power-consumption buffer 90 to the internal circuit.

Figure 11:
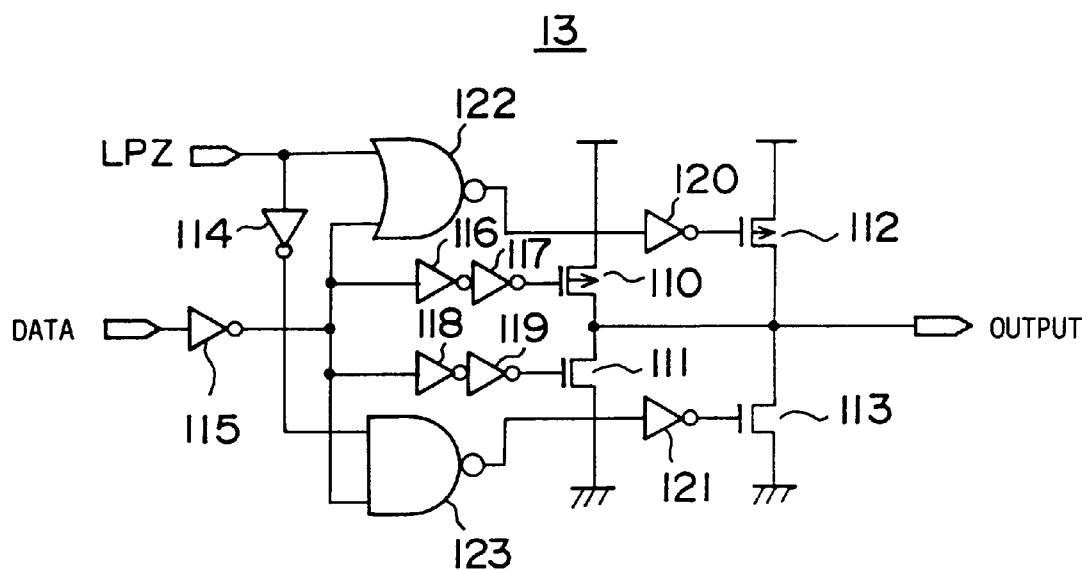
FIG. 11 is a circuit diagram of an embodiment of an output buffer shown in FIG. 1.

FIG. 11 is a circuit diagram of an embodiment of the output buffer 13 shown in FIG. 1. The output buffer 13 of FIG. 11 includes a PMOS transistor 110, an NMOS transistor 111, a PMOS transistor 112, an NMOS transistor 113, inverters 114 through 121, a NOR circuit 122, and a NAND circuit 123.

In the output buffer 13 of FIG. 11, power for driving output data is changed by changing dimensions (gate widths) of output transistors according to the mode signal LPZ.

When the mode signal LPZ is HIGH (low-power-consumption mode), an output of the NOR circuit 122 is fixed to LOW so as to stop the PMOS transistor 112 from operating. Also, an output of the NAND circuit 123 is fixed to HIGH so that the NMOS transistor 113 does not operate. In this case, only the PMOS transistor 110 and the NMOS transistor 111 are turned on/off according to input data supplied to the inverter 115. That is, the output data is driven only by the PMOS transistor 110 and the NMOS transistor 111.

When the mode signal LPZ is LOW (high-speed mode), the NOR circuit 122 serves as an inverter for inverting the output of the inverter 115. Likewise, the NAND circuit 123 serves as an inverter for inverting the output of the inverter 115. In this case, the PMOS transistor 112 and the NMOS transistor 113 are turned on/off according to HIGH/LOW of the input data. That is, the output data is driven by the PMOS transistor 112 and the NMOS transistor 113. Further, the PMOS transistor 110 and the NMOS transistor 111 operate in parallel with the PMOS transistor 112 and the NMOS transistor 113. As a result, the output data is driven by both the pair of the PMOS transistor 110 and the NMOS transistor 111 and the pair of the PMOS transistor 112 and the NMOS transistor 113. This means that the dimensions (gate widths) of the output transistors are effectively increased to enhance the driving power (through rate) of the output data.

In this manner, the embodiment of FIG. 11 achieves high-speed signal output by increasing the driving power of the output transistors when the operation mode is the high-speed mode, and avoids excessive power consumption by decreasing the gate widths of the output transistors when the operation mode is the low-power-consumption mode.

The configuration of FIG. 11 may be changed such that only the PMOS transistor 110 and the NMOS transistor 111 are used for driving the output data in the high-speed mode and only the PMOS transistor 112 and the NMOS transistor 113 are used for driving the output data in the low-power-consumption mode. In this modified configuration, the PMOS transistor 110 and the NMOS transistor 111 have larger gate widths than the PMOS transistor 112 and the NMOS transistor 113. In the same manner as in the example of FIG. 11, this modified configuration achieves high-speed signal output by employing the output transistors of high driving power when the operation mode is the high-speed mode, and avoids excessive power consumption by using the output transistors of narrow gate widths when the operation mode is the low-power-consumption mode.

Figure 12A:
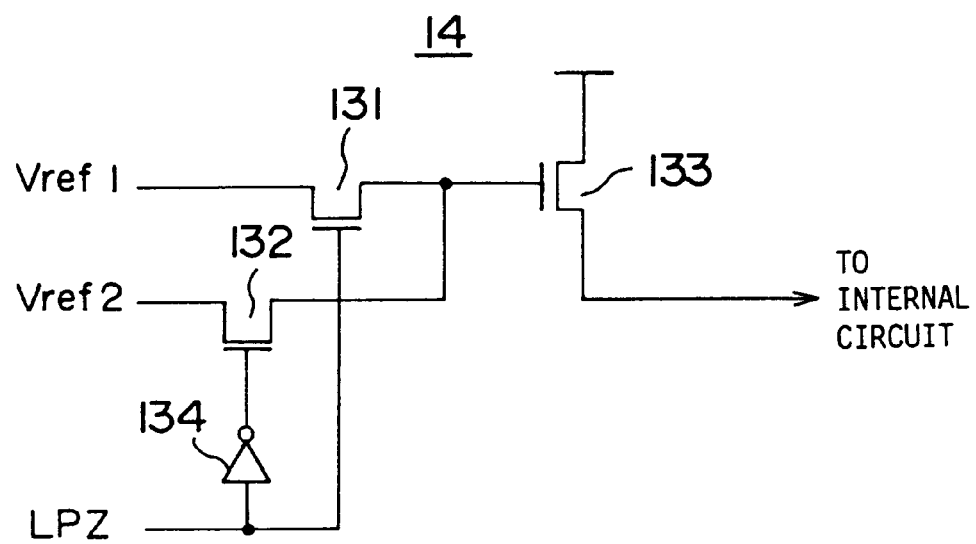
FIGS. 12A and 12B are circuit diagrams of a first embodiment and a second embodiment, respectively, of an internal-voltage generation circuit shown in FIG. 1.
Figure 12B:
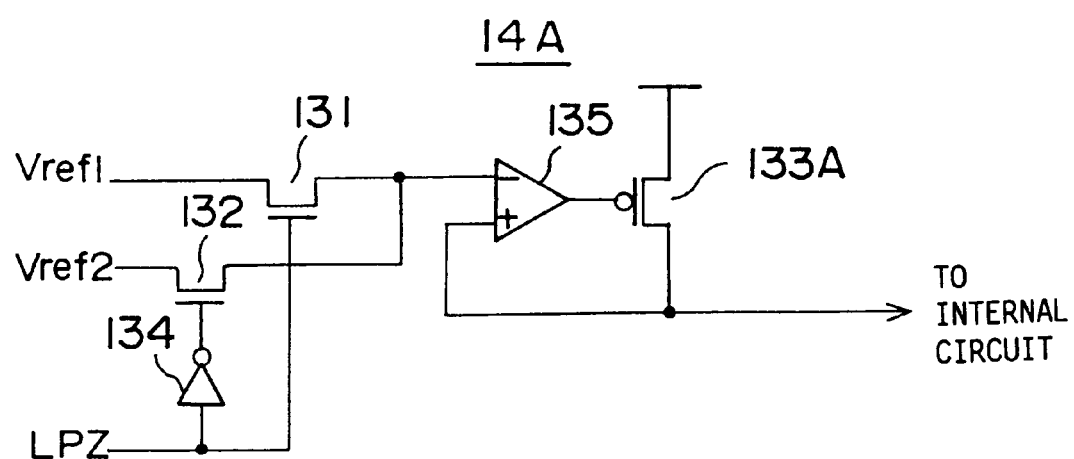

FIGS. 12A and 12B are circuit diagrams of a first embodiment and a second embodiment, respectively, of the internal-voltage generation circuit 14 shown in FIG. 1.

The internal-voltage generation circuit 14 of FIG. 12A includes NMOS transistors 131 through 133 and an inverter 134. The NMOS transistor 131 receives the mode signal LPZ at a gate thereof. A gate of the NMOS transistor 132 receives the inverse mode signal /LPZ which is obtained after an inversion at the inverter 134.

When the mode signal LPZ is LOW (high-speed mode), the NMOS transistor 132 is turned on so that the reference voltage Vref2 is supplied to a gate of the NMOS transistor 133. A voltage supplied to internal circuits is thus the reference voltage Vref2 minus a threshold voltage of the NMOS transistor 133. When the mode signal LPZ is HIGH (low-power-consumption mode), the NMOS transistor 131 is turned on so that the reference voltage Vref1 is supplied to a gate of the NMOS transistor 133. The voltage supplied to internal circuits in this case is the reference voltage Vref1 minus the threshold voltage of the NMOS transistor 133. By setting the reference voltage Vref2 to a voltage higher than the reference voltage Vref1, a relatively high voltage is supplied to the internal circuits in the high-speed mode, and a relatively low voltage is supplied to the internal circuits in the low-power-consumption mode.

The internal-voltage generation circuit 14A of FIG. 12B differs from the internal-voltage generation circuit 14 of FIG. 12A in that the NMOS transistor 133 is replaced by the PMOS transistor 133A, and in that a differential amplifier 135 is provided. The differential amplifier 135 receives a drain voltage of the PMOS transistor 133A supplied to the internal circuits and either one of the reference voltage Vref1 or Vref2 selected by the mode signal LPZ. The differential amplifier 135 compares these voltages with each other. An output of the differential amplifier 135 is applied to the PMOS transistor 133A as a gate voltage. The differential amplifier 135 controls the gate voltage of the PMOS transistor 133A such that the two compared voltages become the same. In this configuration, therefore, when the mode signal LPZ is HIGH (low-power-consumption mode), the voltage supplied to the internal circuits is the reference voltage Vref1. When the mode signal LPZ is LOW (high-speed mode), the voltage supplied to the internal circuits is the reference voltage Vref2. By setting the reference voltage Vref2 to a voltage higher than the reference voltage Vref1, a relatively high voltage is supplied to the internal circuits in the high-speed mode, and a relatively low voltage is supplied to the internal circuits in the low-power-consumption mode.

FIG. 13 is a block diagram of an embodiment of the core circuit 12 shown in FIG. 1. FIG. 13 shows a configuration of a DRAM which is taken as an example of the semiconductor device 10 of FIG. 1, and shows data flows at the time of data-read operations. The core circuit 12 of FIG. 13 includes a memory-cell array 141, a Y decoder 142, an X decoder 143, a data bus 144, and an amplifier 145. The configuration of FIG. 13 is the same as that of a conventional DRAM, except that the amplifier 145 is controlled by the mode signal LPZ in order to cope with both the high-speed mode and the low-power-consumption mode. Only a brief description of the core circuit 12 of FIG. 13 will be provided below.

An address signal applied to the input buffer 11 of FIG. 1 as part of the input data is supplied to the Y decoder 142 and the X decoder 143. The X decoder 143 selects a memory-cell line (not shown) at a selected X position to read the data of selected memory cells to bit lines (not shown). This achieves a word selection. The data on the bit lines is amplified by a series of sense amplifiers (not shown) provided in the memory-cell array 141. The Y decoder 142 selects a sense amplifier at a selected Y position to read the data of the selected sense amplifier to the amplifier 145 via the data bus 144. This achieves a column selection. The amplifier 145 amplifies the data from the data bus 144, and supplied the amplified data to the output buffer 13. The data bus 144 includes two signal lines with respect to each bit, and these two signal lines transfer data by using complementary signals.

The amplifier 145 is controlled by the mode signal LPZ to operate at high speed in the high-speed mode (i.e., when the mode signal LPZ is LOW) and operate with low power consumption in the low-power-consumption mode (i.e., when the mode signal LPZ is HIGH).

Figure 14:
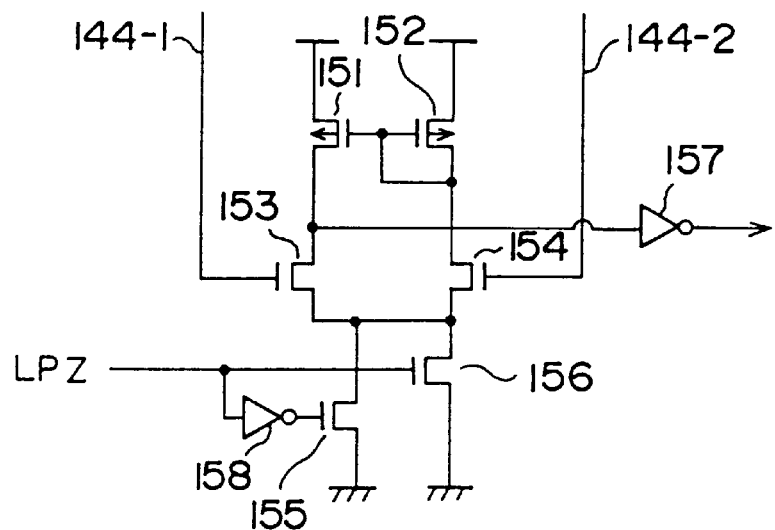
FIG. 14 is a circuit diagram of an embodiment of an amplifier of FIG. 13.

FIG. 14 is a circuit diagram of an embodiment of the amplifier 145.

The amplifier 145 of FIG. 14 includes PMOS transistors 151 and 152, NMOS transistors 153 through 156, and inverters 157 and 158. The amplifier 145 is of a differential type, and has almost an identical configuration to that of the input buffer 11 shown in FIG. 8. In FIG. 8, the gates of the NMOS transistors 43 and 44 are connected to the input-signal voltage Vin and the reference voltage Vref, respectively. On the other hand, gates of the NMOS transistors 153 and 154 in FIG. 14 are connected to a signal-line pair 144-1 and 144-2, respectively, which corresponds to one bit of the data bus 144. The signal-line pair 144-1 and 144-2 transfers complementary signals representing one bit, and the amplifier 145 amplifies a voltage difference between the signal lines of the pair.

In the same manner as in FIG. 8, the NMOS transistor 155 has greater driving power than the NMOS transistor 156. When the mode signal LPZ is LOW and, thus, the NMOS transistor 155 is turned on, the amplifier 145 is driven by a relatively large current, thereby coping with high-speed operations.

On the other hand, when the mode signal LPZ is HIGH and, thus, the NMOS transistor 156 is turned on, the amplifier 145 is driven by a relatively large current. That is, the amplifier 145 can avoid excessive power consumption thereof by using a relatively small current when the frequency of the input clock signal CLK is relatively low.

The amplifier 145 of FIG. 11 has basically the same configuration as that of the input buffer 11 shown in FIG. 8. Alternately, the configuration of the input buffer 11B shown in FIG. 10 may be used for the amplifier 145.

Figure 15:
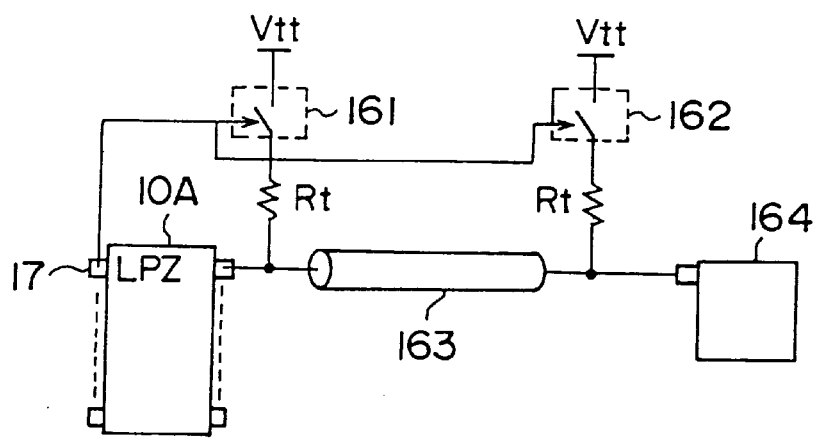
FIG. 15 is an illustrative drawing showing a system configuration in which the semiconductor device of the present invention is applied to a system using termination resistors to terminate a bus.

FIG. 15 is an illustrative drawing showing a system configuration in which the semiconductor device of the present invention is applied to a system using termination resistors to terminate a bus.

The system of FIG. 15 includes switch circuits 161 and 162, termination resistors Rt, a bus 163 connected to a termination voltage Vtt via the termination resistors Rt, a semiconductor device 10A of the present invention, and a semiconductor device 164. In general, when high-speed operations are required in a system, one way of achieving this is to couple a bus to a termination voltage via termination resistors so as to suppress undesirable signal reflection at bus ends. When the bus is terminated, however, currents flow through the termination resistors so that power consumption of the entire system becomes relatively large. In the system of FIG. 15, the mode signal LPZ is output from the semiconductor device 10A, and is used for controlling the switch circuits 161 and 162. Based on the mode signal LPZ, the bus 163 is disconnected from the termination voltage Vtt in the low-power-consumption mode so as to suppress power consumption.

The semiconductor device 10A of FIG. 15 is the same as the semiconductor device 10 of FIG. 1, except that the mode signal LPZ from the check circuit 16 is output from an output pin 17 provided to the semiconductor device 10A. The mode signal LPZ is supplied to the switch circuits 161 and 162. When the mode signal LPZ indicates the high-speed mode, the switch circuits 161 and 162 are closed, and the bus 163 is connected to the termination voltage Vtt via the termination resistors Rt. When the mode signal LPZ indicates the low-power-consumption mode, the switch circuits 161 and 162 are opened, and the bus 163 is disconnected from the termination voltage Vtt.

In this manner, high-speed data transfer can be conducted between the semiconductor device 10A and the semiconductor device 164 via the bus 163 when the operation mode is the high-speed mode, whereas a relatively low power is consumed for data transfer in the low-power-consumption mode. Here, PMOS transistors, for example, may be used as the switch circuits 161 and 162, with the mode signal LPZ being input to gates of these PMOS transistors.

As described above, according to the present invention, an appropriate internal signal is extracted from a clock-generation circuit which generates a clock having a predetermined phase relation with an input clock, and the frequency of the input clock is detected based on this internal signal so as to switch the operation mode of the internal circuits. In this configuration, use of a conventionally existing circuit (clock-generation circuit) makes it possible to detect the frequency of the input clock synchronization signal while requiring only a simple circuit to be newly incorporated into a conventional configuration, and the internal circuits can switch to an operation mode suitable for a provided synchronizing frequency.

The clock-generation circuit may be a PLL circuit, and a voltage applied to a voltage-controlled oscillator of the PLL circuit may be extracted and used as the above-mentioned internal signal. In this case, a check circuit for checking the frequency of the input clock requires only a simple configuration which detects the supplied voltage.

The clock-generation circuit may be a DLL circuit, and a control signal for controlling a series of delay elements to determine a delay amount of the DLL circuit may be extracted and used as the above-mentioned internal signal. In this case, the check circuit for checking the frequency of the input clock requires only a simple configuration which detects the signal level of the control signal.

Since the internal circuits switch to an appropriate operation mode based on the check of the input-clock frequency, the internal circuits can operate at high speed when the input clock has a relatively high frequency, and avoid excessive power consumption when the input clock has a relatively low frequency.

The internal circuits may include an input buffer which switches an operation mode thereof according to the frequency of the input clock. This input buffer copes with high-speed signal inputs when the input clock has a relatively high frequency, and avoids excessive power consumption when the input clock has a relatively low frequency.

The internal circuits may include an input buffer made up from two types of different input buffers which are selectively used according to the input-clock frequency. One input buffer is used for coping with high-speed signal inputs when the input clock has a relatively high frequency, and the other input buffer is used for avoiding excessive power consumption when the input clock has a relatively low frequency.

The internal circuits may include an output buffer which switches an operation mode thereof according to the frequency of the input clock. This output buffer drives an output signal with relatively great power to achieve high-speed data transfer when the input clock has a relatively high frequency, and avoids excessive power consumption by using lesser power when the input clock has a relatively low frequency.

This output buffer may use output transistors having relatively wide gate widths to achieve high-speed data transfer when the input clock has a relatively high frequency, and avoids excessive power consumption by using output transistors having relatively narrow gate widths when the input clock has a relatively low frequency.

The internal circuits may include an internal-voltage-generation circuit which switches an operation mode thereof according to the frequency of the input clock. This internal-voltage-generation circuit generates a high voltage when the input clock has a relatively high frequency, and avoids excessive power consumption by supplying a relatively low voltage to other internal circuits when the input clock has a relatively low frequency.

The internal circuits may include an amplifier for amplifying signals read from memory cells. This amplifier switches an operation mode thereof according to the frequency of the input clock so as to cope with high-speed operations in the case of high clock frequency and to avoid excessive power consumption in the case of low clock frequency.

The check circuit for checking the frequency of the input clock may incorporate hysteresis characteristics into relations between the frequency of the input clock and the change of the operation mode. In this configuration, even when the input clock has a fluctuated frequency because of noise, irregular and frequent mode transitions can be avoided.

Such hysteresis characteristics are easily incorporated into the check circuit by using a latch circuit and a control circuit for updating the data of the latch circuit.

Check results of the input-clock frequency may be output from the device in order to allow an external system to switch an operation mode thereof according to the frequency of the input clock.

The above-mentioned external system may have a mechanism for connecting/disconnecting a bus to/from a termination voltage, and this mechanism is controlled by the check results of the input-clock frequency. In this configuration, the system in its entirety can switch between the high-speed mode and the low-speed mode according to the frequency of the input clock.

Further, the present invention is not limited to these embodiments, but various variations and modifications may be made without departing from the scope of the present invention.

What is claimed is:

1. A semiconductor device which operates in synchronism with a first clock externally provided thereto, said semiconductor device comprising:

a clock-generation circuit generating a second clock which maintains a predetermined phase relation with said first clock;

a check circuit for checking a frequency of said first clock based on at least one internal signal generated by said clock-generation circuit so as to generate a mode signal representing a discreet value indicative of a corresponding one of a plurality of frequency ranges of the first clock such that the mode signal exhibits hysteresis characteristics at a time of transition between the frequency ranges; and an internal circuit which switches an operation mode thereof according to the mode signal.

2. The semiconductor device as claimed in claim 1, wherein said clock-generation circuit comprises a phase-locked-loop circuit.

3. The semiconductor device as claimed in claim 2, wherein said phase-locked-loop circuit comprises a voltage-controlled oscillator receiving a voltage signal as an input, and said at least one internal signal includes said voltage signal.

4. A semiconductor device which operates in synchronism with a first clock externally provided thereto, said semiconductor device comprising:

a clock-generation circuit generating a second clock which maintains a predetermined phase relation with said first clock;

a check circuit for checking a frequency of said first clock based on at least one internal signal generated by said clock-generation circuit so as to generate a mode signal representing a discreet value indicative of a corresponding one of a plurality of frequency ranges of the first clock such that the mode signal exhibits hysteresis characteristics at a time of transition between the frequency ranges; and an internal circuit which switches an operation mode thereof according to results of said checking, wherein said clock-generation circuit comprises a delay-locked-loop circuit.

5. The semiconductor device as claimed in claim 4, wherein said delay-locked-loop circuit comprises a series of delay elements for delaying said first clock by a predetermined delay amount, and said at least one internal signal includes at least one control signal used for controlling said series of delay elements to determine said predetermined delay amount.

6. A semiconductor device which operates in synchronism with a first clock externally provided thereto, said semiconductor device comprising:

a clock-generation circuit generating a second clock which maintains a predetermined phase relation with said first clock;

a check circuit for checking a frequency of said first clock based on at least one internal signal generated by said clock-generation circuit so as to generate a mode signal representing a discreet value indicative of a corresponding one of a plurality of frequency ranges of the first clock such that the mode signal exhibits hysteresis characteristics at a time of transition between the frequency ranges; and an internal circuit which switches an operation mode thereof according to said mode signal, wherein said internal circuit is capable of operating in a first operation mode at a frequency lower than a predetermined frequency and operating in a second operation mode at a frequency higher than said predetermined frequency, said internal circuit consuming less power in said first operation mode than in said second operation mode, wherein said internal circuit comprises an input buffer for receiving input signals, and said input buffer is driven by a first current amount in said first operation mode and by a second current amount in said second operation mode, said second current amount being larger than said first current amount.

7. A semiconductor device which operates in synchronism with a first clock externally provided thereto, said semiconductor device comprising:

a clock-generation circuit generating a second clock which maintains a predetermined phase relation with said first clock;

a check circuit for checking a frequency of said first clock based on at least one internal signal generated by said clock-generation circuit; and an internal circuit which switches an operation mode thereof according to results of said checking, wherein said internal circuit is capable of operating in a first operation mode at a frequency lower than a predetermined frequency and operating in a second operation mode at a frequency higher than said predetermined frequency, said internal circuit consuming less power in said first operation mode than in said second operation mode, wherein said internal circuit comprises an input buffer for receiving input signals, and said input buffer includes:
   a latch-type first buffer operating in said first operation mode; and
   a differential-amplifier-type buffer operating in said second operation mode.

8. A semiconductor device which operates in synchronism with a first clock externally provided thereto, said semiconductor device comprising:

a clock-generation circuit generating a second clock which maintains a predetermined phase relation with said first clock;

a check circuit for checking a frequency of said first clock based on at least one internal signal generated by said clock-generation circuit so as to generate a mode signal representing a discreet value indicative of a corresponding one of a plurality of frequency ranges of the first clock such that the mode signal exhibits hysteresis characteristics at a time of transition between the frequency ranges; and an internal circuit which switches an operation mode thereof according to said mode signal, wherein said internal circuit is capable of operating in a first operation mode at a frequency lower than a predetermined frequency and operating in a second operation mode at a frequency higher than said predetermined frequency, said internal circuit consuming less power in said first operation mode than in said second operation mode, wherein said internal circuit comprises an output buffer for outputting an output signal, and said output buffer drives said output signal with a first power in said first operation mode and with a second power in said second operation mode, said second power being greater than said first power.

9. The semiconductor device as claimed in claim 8, wherein said output buffer includes output transistors for outputting said output signal, said output transistors having wider gate widths in said second operation mode than in said first operation mode.

10. A semiconductor device which operates in synchronism with a first clock externally provided thereto, said semiconductor device comprising:

a clock-generation circuit generating a second clock which maintains a predetermined phase relation with said first clock;

a check circuit for checking a frequency of said first clock based on at least one internal signal generated by said clock-generation circuit; and an internal circuit which switches an operation mode thereof according to results of said checking, wherein said internal circuit is capable of operating in a first operation mode at a frequency lower than a predetermined frequency and operating in a second operation mode at a frequency higher than said predetermined frequency, said internal circuit consuming less power in said first operation mode than in said second operation mode, wherein said internal circuit comprises an internal-voltage-generation circuit for generating an internal voltage used in said semiconductor device, said internal-voltage-generation circuit generating a first internal voltage in said first operation mode and generating a second internal voltage higher than said first internal voltage in said second operation mode.

11. A semiconductor device which operates in synchronism with a first clock externally provided thereto, said semiconductor device comprising:

a clock-generation circuit generating a second clock which maintains a predetermined phase relation with said first clock;

a check circuit for checking a frequency of said first clock based on at least one internal signal generated by said clock-generation circuit; and an internal circuit which switches an operation mode thereof according to results of said checking, wherein said internal circuit is capable of operating in a first operation mode at a frequency lower than a predetermined frequency and operating in a second operation mode at a frequency higher than said predetermined frequency, said internal circuit consuming less power in said first operation mode than in said second operation mode, wherein said internal circuit comprises:
   a memory-cell array for storing data;
   a data bus for transferring the data read from said memory-cell array; and an amplifier for amplifying a signal representing the data on said data bus, said amplifier consuming less power in said first operation mode than in said second operation mode.

12. A semiconductor device which operates in synchronism with a first clock externally provided thereto, said semiconductor device comprising:

a clock-generation circuit generating a second clock which maintains a predetermined phase relation with said first clock;

a check circuit for checking a frequency of said first clock based on at least one internal signal generated by said clock-generation circuit, wherein said check circuit comprises:

a latch circuit for holding data which indicates one of a first operation mode and a second operation mode; and a control circuit for setting first data to said latch circuit when said frequency of said first clock is higher than a first frequency, setting second data to said latch circuit when said frequency of said first clock is lower than a second frequency, and keeping said data of said latch circuit when said frequency of said first clock is between said first frequency and said second frequency; and an internal circuit which switches an operation mode thereof according to results of said checking, wherein said internal circuit is capable of operating in said first operation mode at a frequency lower than a predetermined frequency and operating in said second operation mode at a frequency higher than said predetermined frequency, said internal circuit consuming less power in said first operation mode than in said second operation mode, wherein said check circuit ascertains that an operation mode is switched from said first operation mode to said second operation mode when said frequency of said first clock increases and becomes higher than said first frequency, and ascertains that an operation mode is switched from said second operation mode to said first operation mode when said frequency of said first clock decreases and becomes lower than said second frequency, said first frequency being higher than said second frequency.

13. The semiconductor device as claimed in claim 12, further comprising an output node for outputting said results of said checking from said semiconductor device.

14. A system for signal transfer, said system comprising:

a bus for signal transfer;

termination resistors whose one end is connected to said bus;

switch means provided between another end of said termination resistors and a termination voltage; and a semiconductor device connected to said bus, wherein said semiconductor device comprises:

a clock-generation circuit for generating a first clock which maintains a predetermined phase relation with a second clock provided externally to said semiconductor device;

a check circuit for checking a frequency of said second clock based on at least one internal signal generated by said clock-generation circuit;

an internal circuit which operates in one of a high-speed mode and a low-speed mode according to results of said checking; and an output node for outputting said results of said checking from said semiconductor device, wherein said results of said checking output from said output node are used for controlling said switch means so as to connect said bus to said termination voltage via said termination resistors in said high-speed mode and disconnect said bus from said termination voltage in said low-speed mode.

* * * * *